(12) United States Patent
Balhiser et al.

(10) Patent No.: US 7,088,150 B2
(45) Date of Patent: Aug. 8, 2006

(54) DRIVER-SIDE CURRENT CLAMPING WITH NON-PERSISTENT CHARGE BOOST

(75) Inventors: David D. Balhiser, Fort Collins, CO (US); Jason Todd Gentry, Wellington, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/728,604

(22) Filed: Dec. 5, 2003

(65) Prior Publication Data

US 2005/0122141 A1  Jun. 9, 2005

(51) Int. Cl.
*H03K 3/00* (2006.01)

(52) U.S. Cl. ........................ 327/108; 327/170

(58) Field of Classification Search ........ 327/108–112, 327/170; 326/82, 83
See application file for complete search history.

(56) References Cited

U.S. PATENT DOCUMENTS

| | | | |
|---|---|---|---|
| 3,453,447 A | 7/1969 | Campanella | |
| 3,798,471 A * | 3/1974 | Williams et al. | ............ 327/171 |
| 4,066,918 A | 1/1978 | Heuner et al. | |
| 4,760,433 A | 7/1988 | Young et al. | |
| 4,952,916 A | 8/1990 | Taplin | |
| RE33,378 E * | 10/1990 | Mehl | .......................... 327/109 |
| 5,334,889 A * | 8/1994 | Hisaka | ........................ 326/83 |
| 5,444,751 A | 8/1995 | Sage | |
| 5,525,933 A | 6/1996 | Matsuki et al. | |
| 5,574,395 A | 11/1996 | Kusakabe | |
| 5,656,873 A | 8/1997 | O'Loughlin et al. | |
| 5,825,240 A | 10/1998 | Geis et al. | |
| 5,880,621 A | 3/1999 | Ohashi | |
| 6,351,171 B1 | 2/2002 | Balhiser | |
| 6,437,628 B1 * | 8/2002 | Davenport et al. | ......... 327/333 |
| 6,728,494 B1 * | 4/2004 | Numata et al. | ............. 398/182 |

* cited by examiner

*Primary Examiner*—Kenneth B. Wells

(57) ABSTRACT

Under control of an input signal, a signal line is driven toward a first voltage by coupling a first current path to the signal line. While the first current path is coupled to the signal line, 1) a charge boost is provided to the signal line to increase the rate at which a voltage on the signal line switches toward the first voltage, and 2) current flow through the signal line is clamped to prevent a voltage on the signal line from reaching the first voltage. The current flow may be clamped by means of a resistor in the first current path, and the charge boost may be provided by a capacitor that is coupled in parallel with the resistor.

19 Claims, 6 Drawing Sheets

DRIVER-SIDE CURRENT CLAMPING WITH NON-PERSISTENT CHARGE BOOST

BACKGROUND OF THE INVENTION

When designing and manufacturing integrated circuits, it is often necessary to increase the speed at which signals propagate over a signal line. There are many ways of doing this. One way is to manipulate line-width and driver strength, including the use of tapered signal lines. Another way is to incorporate one or more repeaters (e.g., inverters) into a signal line. Yet other ways include custom design architectures and/or signal routes. These last options, however, are typically the most expensive (but sometimes necessary) way to speed signal propagation.

SUMMARY OF THE INVENTION

One aspect of the invention is embodied in a method. In accordance with the method, a signal line is driven toward a first voltage by coupling a first current path to the signal line (under control of an input signal). While the first current path is coupled to the signal line, 1) a non-persistent charge boost is provided to the signal line to increase the rate at which a voltage on the signal line switches toward the first voltage, and 2) current flow through the signal line is clamped to prevent the voltage on the signal line from reaching the first voltage.

Another aspect of the invention is embodied in a driver circuit. The driver circuit comprises a first current path that is coupled to a first voltage supply. A first switching circuit, under control of an input signal, couples and uncouples the first current path to an output of the driver circuit. A first current clamp, coupled in the first current path, prevents a voltage at the output from reaching the first voltage. A first non-persistent charge boost circuit, coupled to the first switching circuit, increases the rate at which the output switches toward the first voltage when the first current path is coupled to the output.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
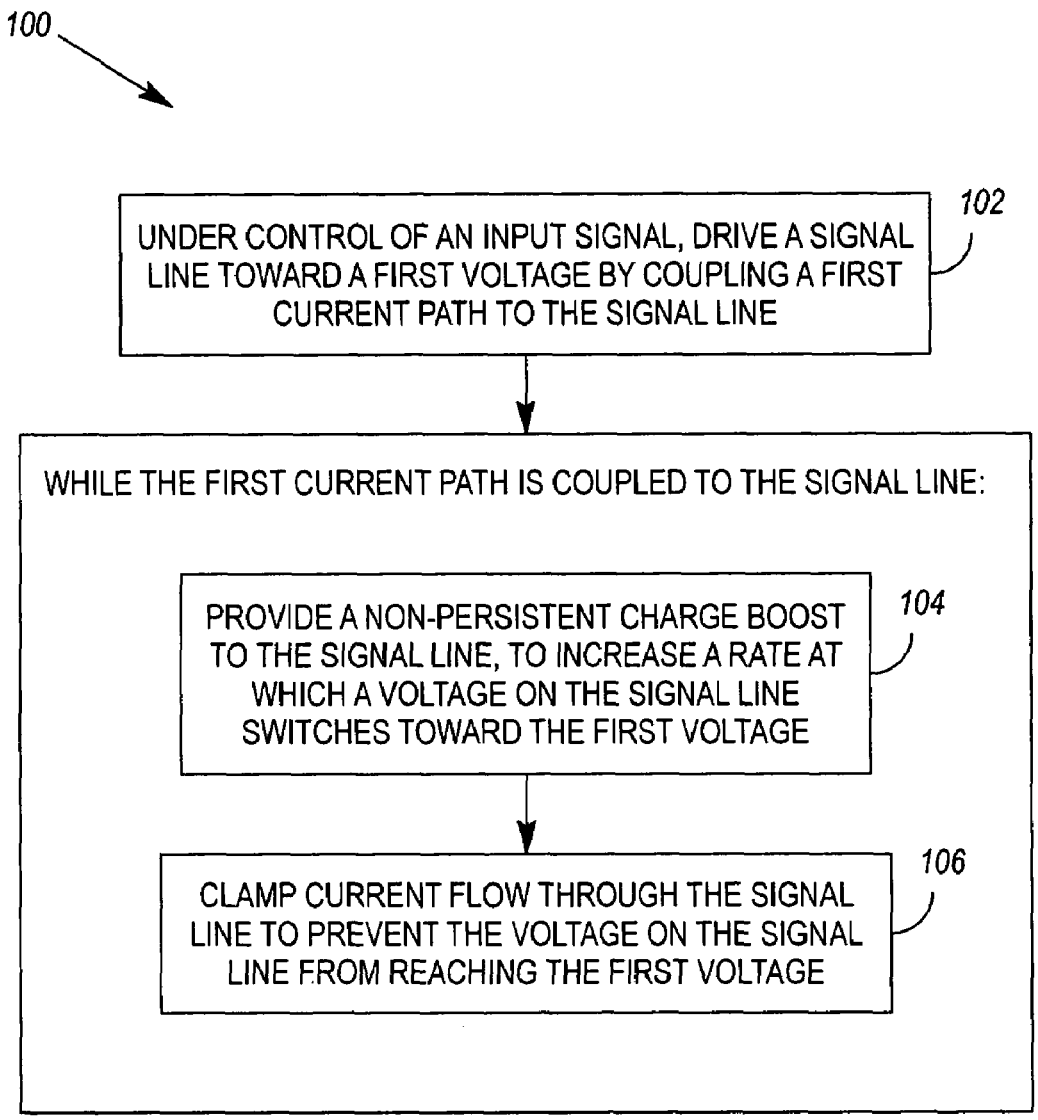
FIG. 1 illustrates a first exemplary method for increasing the speed at which signals propagate over a signal line.

FIG. 1 illustrates a method 100 for increasing the speed at which signals propagate over a signal line. In accordance with the method, an input signal controls the coupling 102 of a first current path to a signal line. When the first current path is coupled to the signal line, 1) the signal line is driven toward a first voltage, 2) a non-persistent charge boost is provided 104 to the signal line to increase the rate at which a voltage on the signal line switches toward the first voltage, and 3) current flow through the signal line is clamped 106 to prevent the voltage on the signal line from reaching the first voltage.

By providing the non-persistent charge boost to the signal line upon coupling the first current path to the signal line, the signal line is driven toward the first voltage more quickly, thereby increasing signal propagation speed over the signal line. By clamping current flow through the signal line and preventing the voltage on the signal line from reaching the first voltage, the degree to which voltage on the signal line needs to be swung to switch the signal line toward a second voltage is reduced, thereby increasing switching speed when the signal line needs to be driven toward the second voltage.

Figure 2:
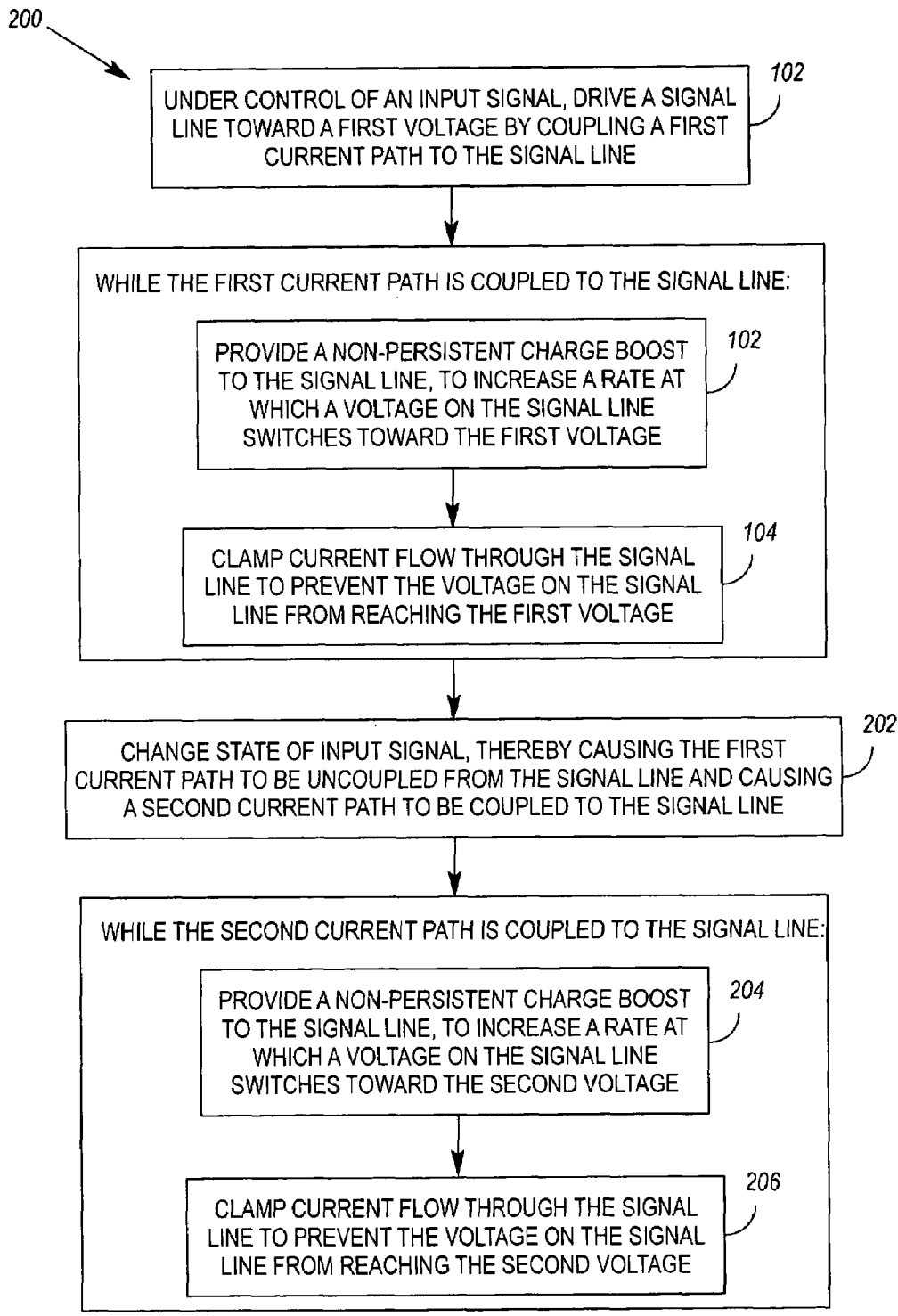
FIG. 2 illustrates a second exemplary method for increasing the speed at which signals propagate over a signal line.

Although the method 100 may be used to increase signal propagation and switching speeds when only one current path is coupled and uncoupled from a signal line, it may be desirable to use the method 100 to increase signal propagation and switching speeds when coupling and uncoupling a pair of current paths to a signal line. Thus, for example, the method 100 may be extended as shown in FIG. 2.

The method 200 begins similarly to the method 100. However, the method 200 proceeds with the input signal changing state 202, thereby causing the first current path to be uncoupled from the signal line and causing a second current path to be coupled to the signal line. When the second current path is coupled to the signal line, 1) the signal line is driven toward a second voltage, 2) a non-persistent charge boost is provided 204 to the signal line to increase the rate at which the voltage on the signal line switches toward the second voltage, and 3) current flow through the signal line is clamped 206 to prevent the voltage on the signal line from reaching the second voltage.

The methods 100 & 200 may be used in conjunction with methods that clamp the voltages allowed at a receiving end of a signal line to a range of voltages that is smaller than a range of voltages allowed at a driven end of the signal line. Such a voltage clamping method is taught in the U.S. Pat. No. 6,351,171 of Balhiser entitled "Accelerated Interconnect Transmission via Voltage Clamping Toward Toggle Point" (which patent is hereby incorporated by reference for all that it discloses).

Figure 3:
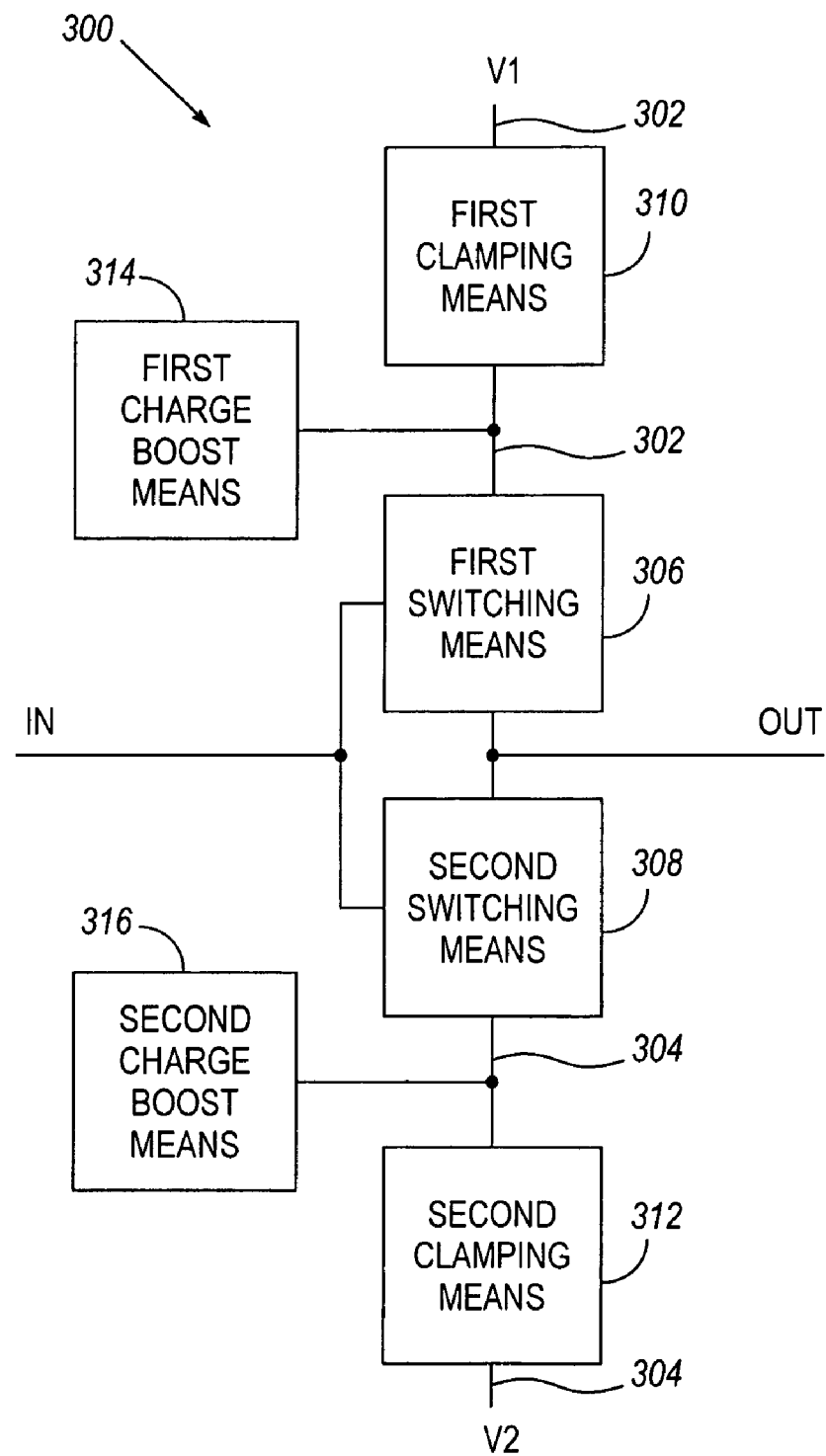
FIG. 3 illustrates a first exemplary driver circuit that implements driver-side current clamping with a non-persistent charge boost.

FIG. 3 illustrates a first embodiment of a driver circuit 300 that may be used to implement the method 100 or 200. The driver circuit 300 comprises a first current path 302 that is coupled to a first voltage (V1), and a second current path 304 that is coupled to a second voltage (V2). The driver circuit 300 further comprises a first switching means 306 to couple and uncouple the first current path 302 to an output of the driver circuit, and a second switching means 308 to alternately couple and uncouple the second current path 304 to the driver's output. A first current clamping means 310 is coupled in the first current path, and prevents a voltage at the driver output from reaching the first voltage. Likewise, a second current clamping means 312 is coupled in the second current path, and prevents the driver's output voltage from reaching the second voltage. When the first current path 302 is coupled to the driver output, a first non-persistent charge boost means 314, coupled to the first switching means 306, increases the rate at which the driver's output voltage switches toward (but not to) the first voltage. Similarly, when the second current path 304 is coupled to the driver output, a second non-persistent charge boost means 316, coupled to the second switching means 308, increases the rate at which the driver's output voltage switches toward (but not to) the second voltage.

Note that although the driver circuit 300 comprises a current clamping means and non-persistent charge boost means coupled to each current path that influences the state of the driver's output, the driver circuit 300 could alternately comprise a current clamping means and/or non-persistent charge boost means coupled to only one of the current paths.

Figure 4:
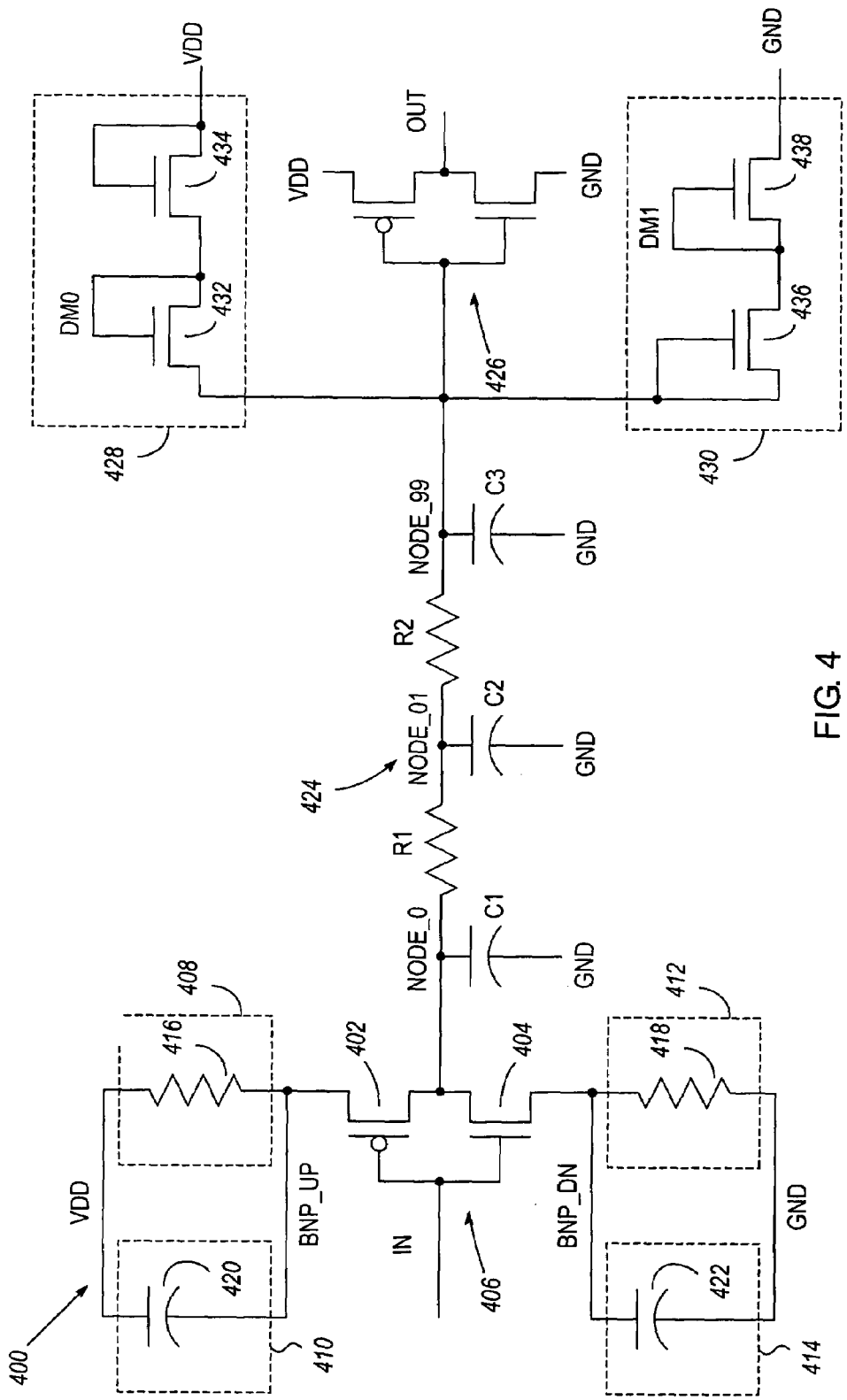
FIG. 4 illustrates a second exemplary driver circuit that implements driver-side current clamping with a non-persistent charge boost.

FIG. 4 illustrates a second embodiment of a driver circuit 400 that may be used to implement the method 100 or 200. The driver circuit 400 comprises first and second switching circuits 402, 404, each of which is controlled by an input signal received at node IN. By way of example, the switching circuits 402, 404 may form an inverting complementary metal-oxide semiconductor (CMOS) buffer 406 (i.e., with the first switching circuit taking the form of a p-channel field effect transistor (PFET), and with the second switching circuit taking the form of an n-channel field effect transistor (NFET)). The PFET is coupled via its source and drain between an output of the driver circuit (NODE_0) and a first intermediate node (BNP_UP). The NFET is coupled via its source and drain between NODE_0 and a second intermediate node (BNP_DN). The gates of the two FETs are coupled to each other at node IN, which is configured to receive an input signal.

The node BNP_UP is coupled to a first voltage (VDD) by means of a current clamp 408 and a non-persistent charge boost circuit 410. In a similar fashion, the node BNP_DN is coupled to a second voltage (GND) by means of a current clamp 412 and a non-persistent charge boost circuit 414. As shown in FIG. 4, corresponding ones of the clamps and boost circuits 408/410, 412/414 may be coupled in parallel, with each clamp taking the form of a resistor 416, 418, and with each boost circuit taking the form of a capacitor 420, 422.

In operation, a low input signal at node IN causes the PFET 402 to conduct, thereby causing a current path through PFET 402 and resistor 416 to be coupled to the driver's output (i.e., NODE_0). Assuming that capacitor 420 already holds a charge, the charge on the capacitor is now released to provide a non-persistent positive charge boost to the driver's output. This first non-persistent charge boost increases the rate at which the driver's output switches toward VDD. As the voltage on the driver's output rises, current flow at the output is impeded as a result of resistor 416, and the voltage at the driver's output is limited to something less than VDD. If the input signal then rises high, the PFET 402 will cease to conduct, and the NFET 404 will begin to conduct. Again, assuming that capacitor 422 already holds a charge, the charge on the capacitor is now released to provide a non-persistent negative charge boost to the driver's output. This second non-persistent charge boost increases the rate at which the driver's output switches toward GND. As the voltage on the driver's output falls, current flow at the output is impeded as a result of resistor 418, and the voltage at the driver's output is limited to something more than GND.

When the current path through PFET 402 and resistor 416 is uncoupled from the driver's output, capacitor 420 is charged (or "armed") as a result of the voltage drop across resistor 416. Likewise, when the current path through NFET 404 and resistor 418 is uncoupled from the driver's output, capacitor 422 is charged as a result of the voltage drop across resistor 418. The implementation of the current clamps 408 and 412 therefore provides a means for arming the charge boost circuits 410 and 414.

As shown in FIG. 4, the output of the driver circuit 400 may be coupled to a signal line 424 that is associated with a line resistance (as illustrated by resistances R1 and R2) and a line capacitance (as illustrated by capacitances C1, C2 and C3). The receiving end of signal line 424 may be coupled to a receiver 426. By way of example, the receiver 426 is shown to be an inverting CMOS buffer. In such an arrangement, it may be beneficial to choose each of the charge boost capacitors 420, 422 such that its value is at least twice the sum of 1) the capacitance of the signal line 424, and 2) the gate capacitance of the receiver 426. Choosing larger values for the capacitors 420, 422 will provide more boost, but at the cost of more chip area; and choosing smaller values for the capacitors 420, 422 will diminish the boost. In choosing values for the clamping resistors 416, 418, it should be noted that larger values decrease power consumption, but at the expense of greater chip area.

Figure 5:
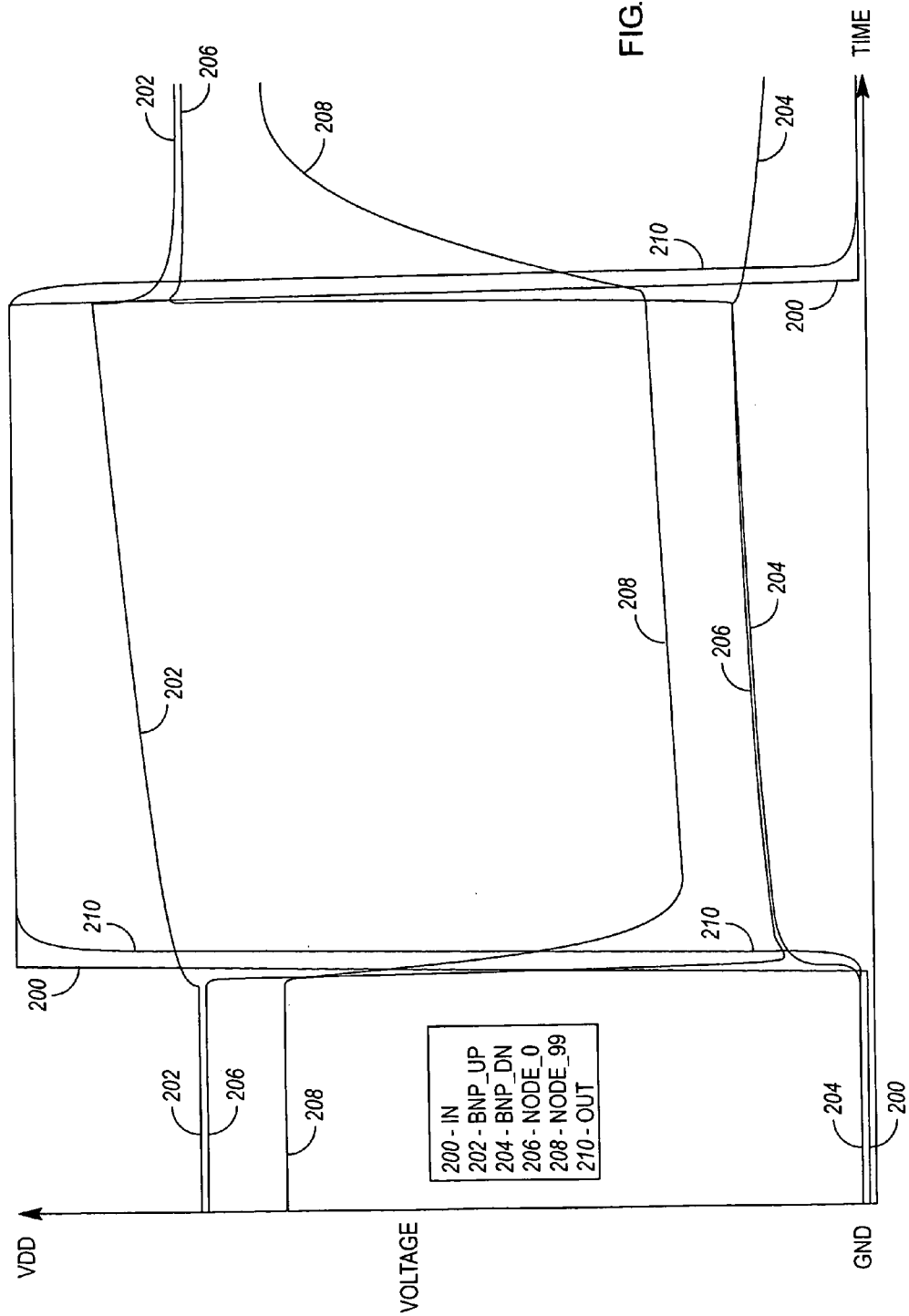
FIG. 5 illustrates an exemplary timing of signals for the FIG. 4 driver circuit.

In accordance with the teachings of U.S. Pat. No. 6,351,171, referenced supra, first and second voltage clamps 428, 430 may be coupled to the signal line 424 in proximity to the receiver 426. In this manner, the voltage at the receiver 426 may be prevented from reaching either of voltages VDD or GND. By way of example, each voltage clamp 428, 430 may be implemented by means of a series pair of diode-connected NFETs 432/434, 436/438. In one embodiment of the FIG. 4 apparatus, the range of voltages allowed at the driven end of the signal line 424 is smaller than the range of voltages between VDD and GND, but greater than the range of voltages allowed at the receiving end of the signal line. Thus, at any given instant, a voltage gradient exists on the signal line. In such an embodiment, the voltages appearing at nodes IN, BNP_UP, BNP_DN, NODE_0, NODE_99 and OUT as an input signal switches from GND to VDD and back to GND might appear as shown in FIG. 5.

Figure 6:
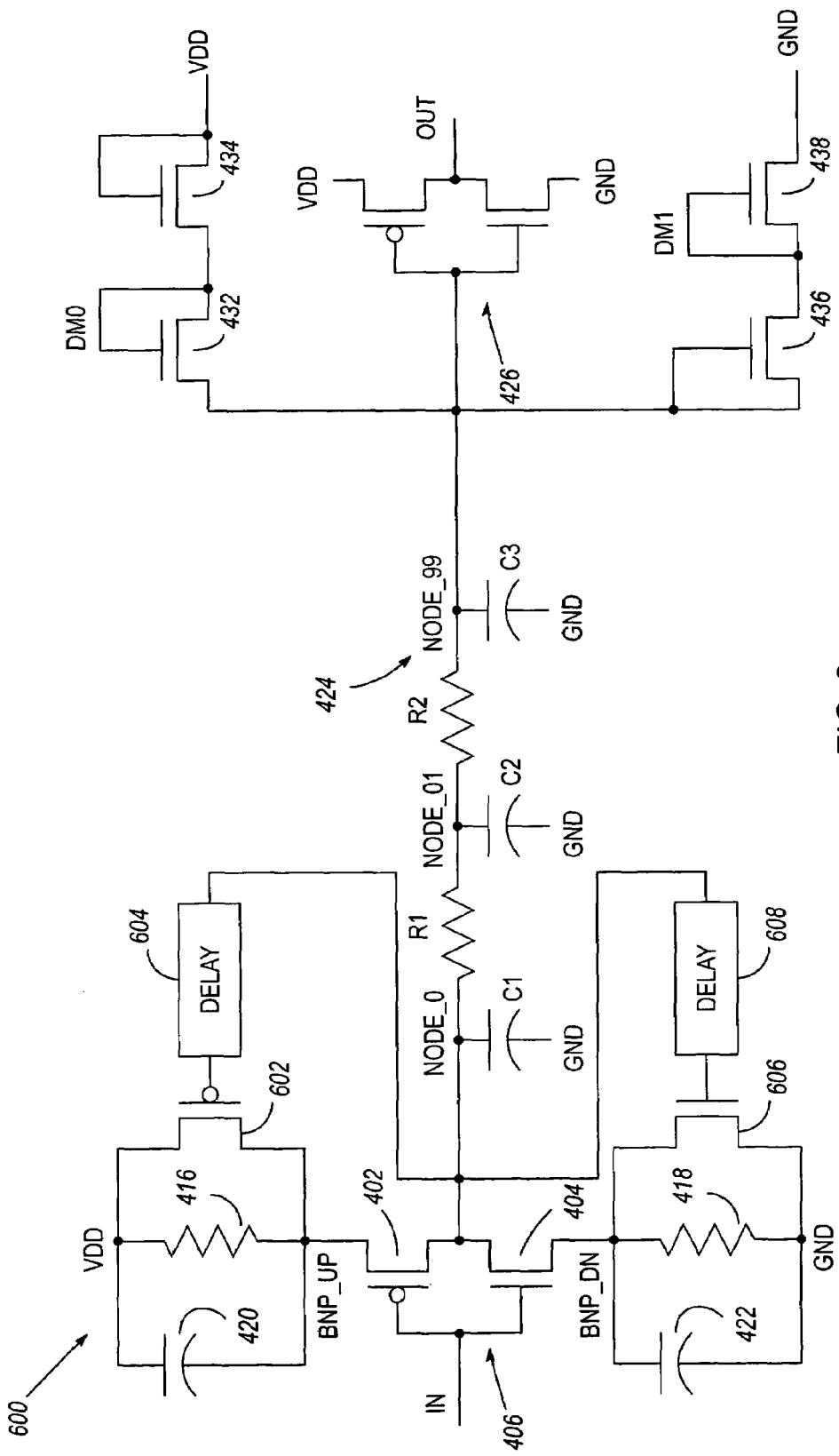
FIG. 6 illustrates an alternate embodiment of the FIG. 4 driver circuit.

FIG. 6 illustrates an alternate embodiment of the FIG. 4 driver circuit. In the driver circuit 600, additional non-persistent boost is provided by FETs 602, 606, each of which is coupled in parallel with a corresponding non-persistent charge boost capacitor 420, 422. Thus, as shown, NFET 602 may be coupled in parallel with capacitor 420, and PFET 606 may be coupled in parallel with capacitor 422 (with parallel connections being made with the source and drain terminals of each FET and its corresponding capacitor). The gates of the FETs 602, 606 are coupled to the driver's output (i.e., NODE_0) via delay circuits 604, 608. In this manner, each FET conducts prior to when it is switched into the active current path of the driver circuit 600. In this. manner, each FET brings its output node (BNP_UP or BNP_DN) to a maximum voltage (VDD or GND) prior to its output node being switched into the active current path of the driver circuit 600. However, as a result of the delay circuits 604, 608, the boost provided by each FET is non-persistent. For example, PFET 602 conducts while the gate of PFET 402 is driven high. When the gate of PFET 402 is driven low, PFET 602 provides a boost to NODE_0 until such time that the change of state of NODE.0 propagates through delay circuit 604 to thereby pull the gate of PFET 602 high and cause PFET 602 to cease conducting. At this point in time, clamp resistor 416 begins to limit the voltage at node BNP_UP. Later, when node BNP_UP is once again switched to the inactive current path of drive circuit 600, the existence of delay circuit 604 provides a period of time for clamp resistor 416 to charge boost capacitor 420 before PFET 602 once again begins to conduct.

Each of the delay circuits 604, 608 shown in FIG. 6 may be implemented using a chain of buffer or inverter elements. And, if separate control over the positive and negative charge boost delays is not needed, the delay circuits 604, 608 may be merged into a common delay circuit (not shown).

When used in conjunction with voltage clamping at the driven end of a signal line, the methods and apparatus disclosed herein minimize the voltage gradient on a signal line and constrain the maximum and minimum charges stored on the signal line. This results in a lower RC time constant than using voltage clamping alone. It also results in less static current and, thus, less power dissipation. Two normally contradictory objectives may therefore be achieved. That is, static current is limited while dynamic switching current is virtually unimpeded (which typically results in power savings and faster signal propagation).

Of significance for some applications, the methods and apparatus disclosed herein may also be used as "in-place-optimizations" (IPOs) to fix problems with critical signal routes found late in the design and/or manufacture stage of an integrated circuit.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A driver circuit, comprising:
   a first current path coupled to a first voltage;
   a first switching circuit, under control of an input signal, to couple and uncouple the first current path to an output of the driver circuit;
   a first current clamp, coupled in the first current path, to prevent a voltage at the output of the driver circuit from reaching said first voltage;
   a delay circuit, coupled to the output of the driver circuit; and
   a first non-persistent charge boost circuit, to increase a rate at which the output of the driver circuit switches toward the first voltage when the first current path is coupled to the output of the driver circuit, wherein the charge boost circuit comprises a field effect transistor that is i) coupled in parallel with the first current clamp via its source and drain terminals, and ii) has its gate coupled to an output of the delay circuit.

2. The driver circuit of claim 1, wherein the first current clamp comprises a resistor.

3. The driver circuit of claim 2, wherein the first non-persistent charge boost circuit comprises a capacitor, coupled in parallel with said resistor.

4. The driver circuit of claim 2, further comprising:
   a signal line coupled to said output; and
   a receiver coupled to said signal line;
   wherein said capacitor of the first non-persistent charge boost circuit has a value that is at least twice the sum of i) the capacitance of the signal line, and ii) the gate capacitance of the receiver.

5. The driver circuit of claim 1, wherein the first switching circuit comprises a field effect transistor, the source and drain of which are coupled in said first current path, and the gate of which receives said input signal.

6. The driver circuit of claim 1, further comprising:
   a signal line coupled to said output;
   a receiver coupled to said signal line; and
   a voltage clamp, coupled to said signal line in proximity to said receiver, to prevent a voltage at said receiver from reaching said first voltage.

7. The driver circuit of claim 1, further comprising:
   a second current path coupled to a second voltage;
   a second switching circuit, under control of said input signal, to couple and uncouple said second current path to said output;
   a second current clamp, coupled in the second current path, to prevent a voltage at said output from reaching said second voltage; and
   a second non-persistent charge boost circuit, coupled to the second switching circuit, to increase a rate at which said output switches toward said second voltage when said second current path is coupled to said output.

8. The driver circuit of claim 7, further comprising a second delay circuit, coupled to the output of the driver circuit, wherein:
   the second non-persistent charge boost circuit comprises a second field effect transistor that is coupled in the second current path via its source and drain terminals; and
   the gate of the second field effect transistor is coupled to an output of the second delay circuit.

9. The driver circuit of claim 7, wherein:
   the second non-persistent charge boost circuit comprises a second field effect transistor that is coupled in the second current path via its source and drain terminals; and
   the gate of the second field effect transistor is coupled to the output of the delay circuit.

10. The driver circuit of claim 7, further comprising:
    a signal line coupled to said output;
    a receiver coupled to said signal line; and
    first and second voltage clamps, coupled to said signal line in proximity to said receiver, to prevent a voltage at said receiver from reaching either of said first or second voltages.

11. The driver circuit of claim 1, wherein the first current clamp is coupled to the first non-persistent charge boost circuit to arm the first non-persistent charge boost circuit when the first current path is not coupled to said output.

12. A driver circuit, comprising:
    a first current path coupled to a first voltage;
    first switching means to couple and uncouple the first current path to an output of the driver circuit;
    first current clamping means, coupled in the first current path, to prevent a voltage at the output of the driver circuit from reaching said first voltage;
    delay means, coupled to the output of the driver circuit; and
    first non-persistent charge boost means, to increase a rate at which the output of the driver circuit switches toward the first voltage when the first current path is coupled to the output of the driver circuit, wherein the charge boost means comprises a field effect transistor that is i) coupled in parallel with the first current clamping means via its source and drain terminals, and ii) has its gate coupled to an output of the delay means.

13. The driver circuit of claim 12, further comprising:
    a second current path coupled to a second voltage;
    second switching means to alternately couple and uncouple said second current path to said output;
    second current clamping means, coupled in the second current path, to prevent a voltage at said output from reaching said second voltage; and
    second non-persistent charge boost means, coupled to the second switching means, to increase a rate at which said output switches toward said second voltage when said second current path is coupled to said output.

14. A method, comprising:
under control of an input signal, driving a signal line toward a first voltage by coupling a first current path to the signal line;
while the first current path is coupled to the signal line,
   i) clamping current flow through the signal line, by means of a series-connected resistor in the first current path, to prevent the voltage on the signal line from reaching the first voltage; and
   ii) providing a non-persistent charge boost to the signal line, by means of a field effect transistor that is i) coupled in parallel with said resistor via its source and drain terminals, and ii) has a gate that is driven by a delayed version of the voltage on the signal line, to increase a rate at which a voltage on the signal line switches toward said first voltage.

15. The method of claim 14, further comprising clamping voltages at a receiving end of the signal line to a range of voltages that is smaller than a range of voltages allowed at a driven end of the signal line.

16. The method of claim 14, further comprising:
under control of said input signal, driving said signal line toward a second voltage by uncoupling the first current path from the signal line and coupling a second current path to the signal line;
while the second current path is coupled to the signal line,
   i) providing a non-persistent charge boost to the signal line, to increase a rate at which the voltage on the signal line switches toward said second voltage; and
   ii) clamping current flow through the signal line to prevent a voltage on said signal line from reaching said second voltage.

17. The method of claim 16, further comprising clamping voltages at a receiving end of the signal line to a range of voltages that is smaller than a range of voltages allowed at a driven end of the signal line.

18. The method of claim 14, wherein, when the first current path is uncoupled from the signal line, the method used to clamp current provides a means to arm the charge boost.

19. The method of claim 14, wherein said non-persistent charge boost is further provided by a capacitor, coupled in parallel with said resistor.

* * * * *